(12) United States Patent
Hattori et al.

(10) Patent No.: US 6,225,676 B1
(45) Date of Patent: May 1, 2001

(54) SEMICONDUCTOR DEVICE WITH IMPROVED INTER-ELEMENT ISOLATION

(75) Inventors: Yoshinobu Hattori; Masahiro Tsukahara; Shinji Saito, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/252,930

(22) Filed: Feb. 19, 1999

(30) Foreign Application Priority Data

Jul. 3, 1998 (JP) .................................................. 10-189254

(51) Int. Cl.$^7$ .................................................. H01L 29/86
(52) U.S. Cl. ............................................ 257/516; 257/500
(58) Field of Search .................................. 257/500, 506, 257/510, 516

(56) References Cited

U.S. PATENT DOCUMENTS

| | | | |
|---|---|---|---|
| 5,055,905 | * 10/1991 | Anmo | 357/71 |
| 5,805,410 | * 9/1998 | Lee | 361/303 |
| 5,939,753 | * 8/1999 | Ma et al. | 257/339 |
| 6,104,094 | * 8/2000 | Ban et al. | 257/781 |

* cited by examiner

Primary Examiner—David Hardy
(74) Attorney, Agent, or Firm—Armstrong, Westerman, Hattori, McLeland & Naughton, LLP

(57) ABSTRACT

A semiconductor device having multiple circuit elements capable of performing different functions and that operate at a high frequency includes island regions on which the circuit elements are located and isolation regions that surround the island regions and thus, the circuit elements. The island regions electrically separate the circuit elements from each other. A capacitor is connected between a substrate portion of the semiconductor device and ground. The isolation regions include a conductive region with a conductivity type opposite to the conductivity type of the substrate portion, such that a parasitic capacitor is formed between the substrate portion and the conductive region. The parasitic capacitor prevents signal leakage between the circuit elements and the island regions.

22 Claims, 9 Drawing Sheets

41b (10pF)
41c (100pF)
41d (1000pF)

42b (10pF)
42c (100pF)
42d (1000pF)

SEMICONDUCTOR DEVICE WITH IMPROVED INTER-ELEMENT ISOLATION

BACKGROUND OF THE INVENTION

The invention relates to a semiconductor device, and more particularly, to the inter-element isolation of a semiconductor device having circuits or elements mounted thereon which operate at a high frequency.

A plurality of elements or circuits are mounted on a single chip in order to achieve a higher level of integration, multiple functions, reduced cost and a reduction in size. To reduce the influences of these circuit elements on each other, an inter-element isolation region is formed between the elements. In one technique of providing inter-element isolation, an isolation region located between circuit elements is directly connected to the ground ohmically, thus stabilizing the potential of the isolation region. In another technique, an insulator is interposed between circuit elements and serves as an isolation region that electrically separates adjacent elements from each other.

However, the above-described inter-element isolation techniques fail to pay adequate consideration to high frequency circuits. Thus, there is insufficient isolation between circuits or elements with high frequency signals, allowing mutual interference to occur between the high frequency signals, which causes unstable operation of the semiconductor device.

It is an object of the invention to provide a semiconductor device which operates at a high frequency in a stable manner.

SUMMARY OF THE INVENTION

To achieve the above objective, the present invention provides a semiconductor device comprising: a substrate portion of a predetermined conductivity type connected to a ground; a semiconductor layer disposed on the substrate portion, the semiconductor layer including a plurality of island regions and a corresponding plurality of isolation regions that surround the respective island regions for electrically separating island regions from each other, wherein each of the island regions includes a circuit capable of providing a predetermined function; and a first capacitor having a first terminal connected to either the substrate portion or the semiconductor layer and a second terminal connected to the ground.

The present invention further provides a semiconductor device comprising: a substrate portion of a predetermined conductivity type connected to a ground; and a semiconductor layer disposed on the substrate portion and including a plurality of island regions and an isolation region for electrically separating the adjacent island regions from each other, wherein each of the island regions contains a circuit capable of providing a predetermined function, and the isolation region includes a conductive region having a conductivity type opposite to the substrate portion conductivity type, wherein a parasitic capacitor is formed between the substrate portion and the conductive region.

The present invention provides a semiconductor device comprising: a substrate portion of a predetermined conductivity type connected to a ground; a semiconductor layer disposed on the substrate portion and including a plurality of island regions and an isolation region for electrically separating adjacent island regions from each other, wherein each of the island regions contains a circuit capable of providing a predetermined function, and the isolation region includes a conductive region having a conductivity type opposite to the substrate portion conductivity type; and an embedded layer of a higher concentration of impurities than the conductive region and disposed between the substrate portion and the conductive region, a parasitic capacitor being formed between the substrate portion and the embedded layer and having a capacitance that depends on the impurity concentration of the embedded layer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1:
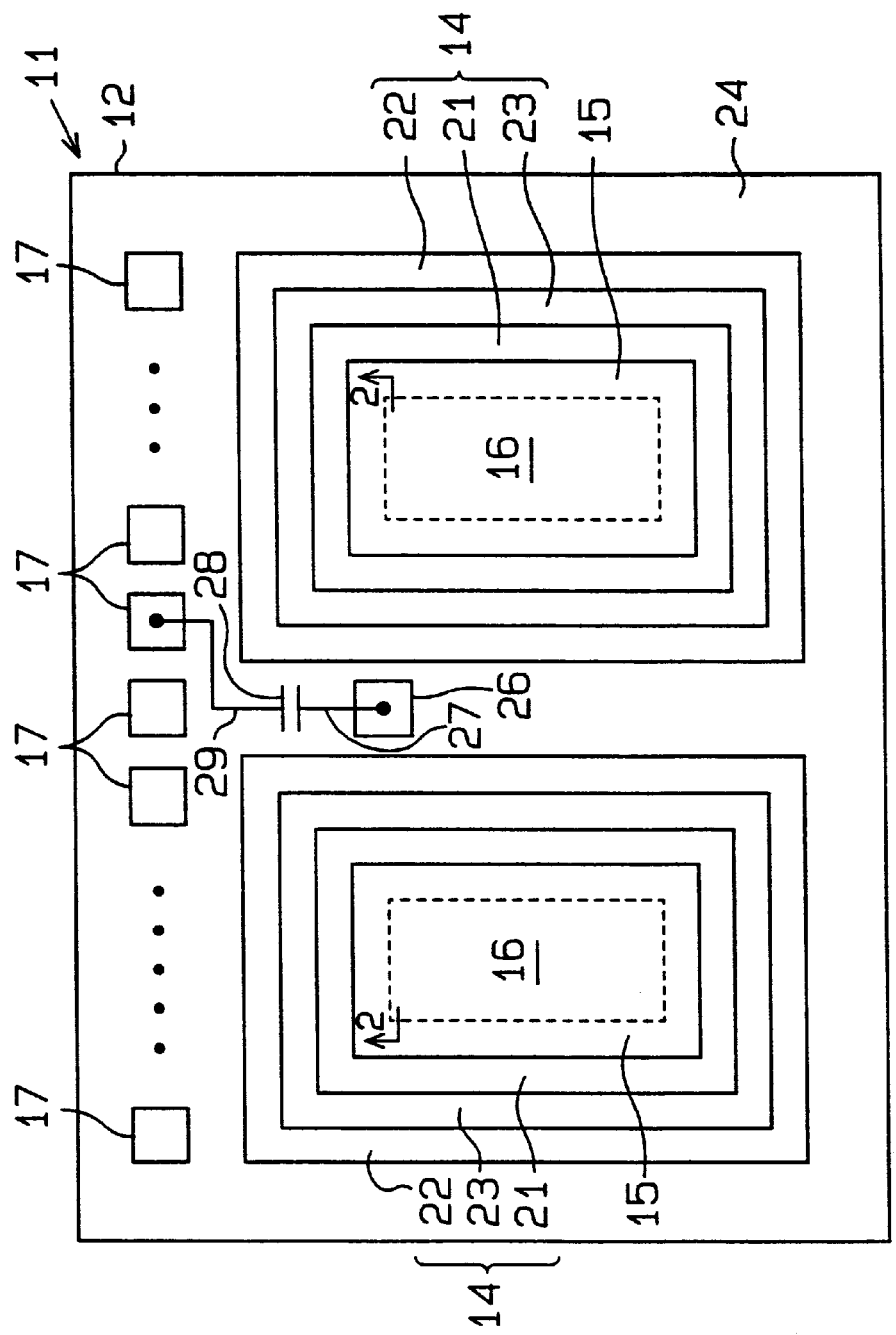
FIG. 1 is a schematic plan view of a semiconductor device according to a first embodiment of the invention.

Referring to FIGS. 1–6, a semiconductor device 11 according to a first embodiment of the present invention will be now described. As shown in FIG. 1, the semiconductor device 11 comprises a semiconductor substrate portion 12, preferably p-type silicon substrate portion, and external terminals 17 and a capacitor 28 mounted on the substrate portion 12. The substrate portion 12 may be an epitaxial layer deposited on a substrate. A pair of island regions 15 and isolation regions 14, which separate the island regions 15 from each other, are defined on the substrate portion 12. Each island region 15 has formed therein a circuit 16, shown in broken lines in FIG. 1, comprising at least one element. Wiring, not shown, provides an electrical connection between the circuits 16 as well as between the circuits 16 and the external terminals 17, so that the semiconductor device 11 functions to allow for the operation of each circuit 16.

The isolation regions 14 each comprise a first isolation area 21 in the form of a generally rectangular frame which surrounds the associated island region 15, a first conductive or semiconductor region 23 which surrounds the island region 15 and a second isolation area 22 spaced by a predetermined distance from the first isolation area 21. A second conductive or semiconductor region 24, which may be connected to the first semiconductor region 23, surrounds the isolation area 14. The external terminals 17 are preferably formed along one side of the substrate portion 12 and on the second semiconductor region 24. Alternatively, the external terminals 17 may be formed along a plurality of sides of the substrate portion 12, or may also be formed on the island regions 15.

Figure 2:
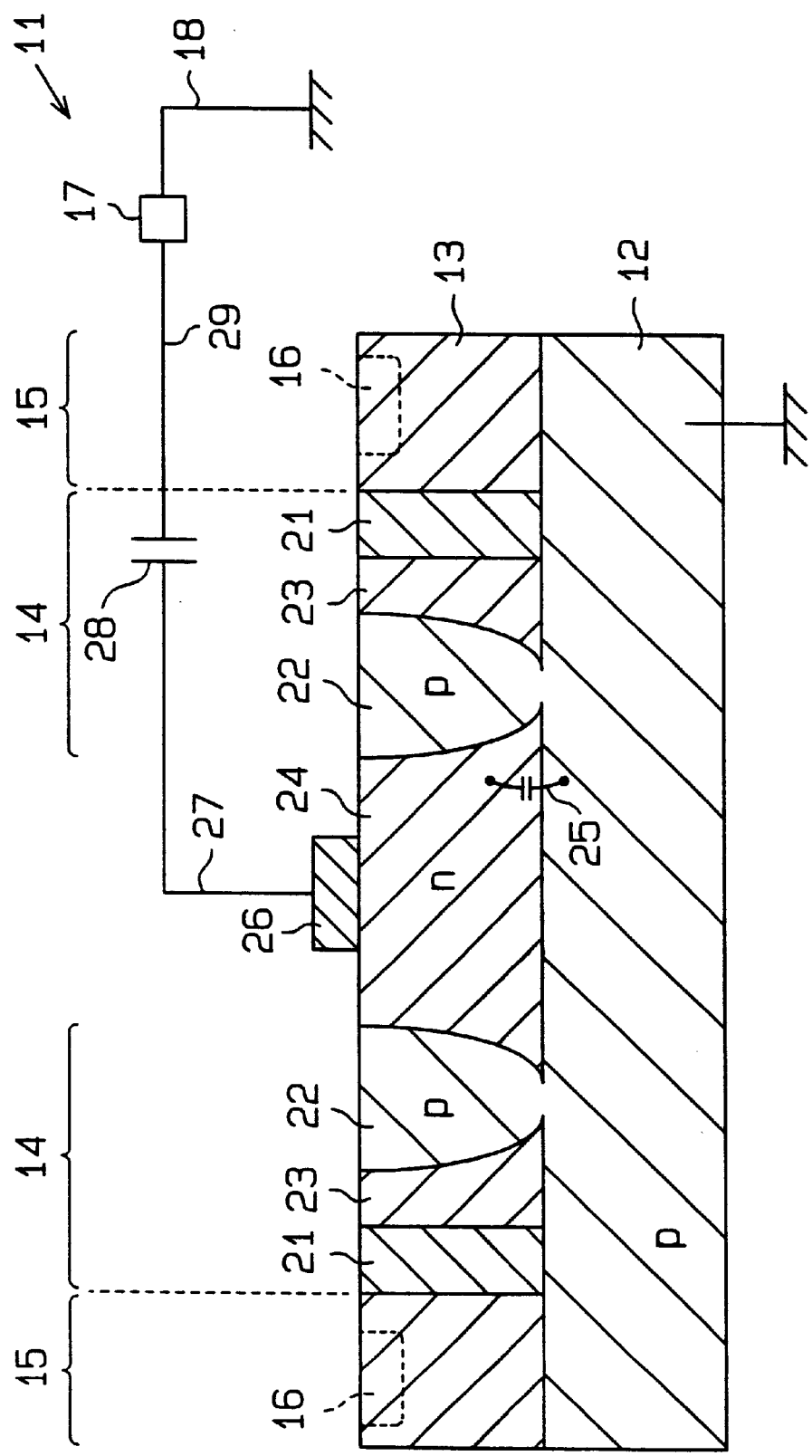
FIG. 2 is a cross-sectional view taken along line 2—2 of the semiconductor device of FIG. 1.

As shown in FIG. 2, a semiconductor layer or n-type epitaxial layer 13 is formed on the substrate portion 12, and the circuit 16, the first and second isolation areas 21, 22 and the first and second semiconductor regions 23, 24 are formed within the n-type epitaxial layer 13. The substrate portion 12 and the second semiconductor region 24 are shared by the pair of island regions 15.

The first isolation area 21 is an insulating region preferably comprising a dielectric. The first isolation. area 21 is formed by initially forming a groove in the surface of the n-type epitaxial layer 13 having a depth which reaches the substrate portion 12, and filling the groove with a dielectric such as CVD oxide film, polycrystalline silicon or the like. The first isolation area 21 provides a partition between the island region 15 and the first semiconductor region 23 and electrically separates the regions 15 and 23 from each other.

The second isolation area 22 is disposed on the outer side or on the opposite side of the first isolation area 21 from the island region 15 and at a predetermined spacing from the area 21. The second isolation area 22 comprises a p-type diffusion region, thus having the opposite conductivity type from the conductivity type (n-type) of the island region 15. The second isolation area 22 has a depth from the surface of the semiconductor region 23 to the substrate portion 12 and a predetermined width. The second isolation area 22 is formed using diffusion or ion implantation during a step of introducing an impurity in the process of manufacturing the circuit 16. The diffusion or ion implantation used defines a pn junction of a desired concentration between the second isolation area 22 and the semiconductor region 23. The pn junction allows the second isolation area 22 to separate electrically the island region 15 and the semiconductor region 23 from each other.

The semiconductor device 11 comprises a parasitic capacitor 25 formed by the pn junction between the first and second semiconductor regions 23, 24 and the substrate portion 12 which is a conductive region. The parasitic capacitor 25 has a capacitance which depends on the impurity concentrations of the substrate portion 12 and the semiconductor regions 23, 24 and an area of a junction therebetween. The area of junction is substantially equal to the surface area of the semiconductor region 23. Accordingly, the parasitic capacitor 25 has a capacitance which depends on the surface area of the semiconductor regions 23, 24.

An electrode layer 26 is formed at a predetermined location on the upper surface of second semiconductor region 24, and is connected via a wiring 27 to a first terminal of a capacitor 28. The second terminal of the capacitor 28 is connected to one of the external terminals 17 via a wiring 29. The external terminal 17 is connected to the ground potential via a bonding wire 18. In this manner, the second semiconductor region 24 is connected to the ground via the capacitor 28. Because the parasitic capacitor 25 exists between the semiconductor regions 23, 24 and the substrate portion 12, the substrate portion 12 is connected to the ground via the parasitic capacitor 25 and the capacitor 28. Stated differently, the parasitic capacitor 25 and the capacitor 28 provide a ground connection of the substrate portion 12 for a high frequency signal. Thus, the semiconductor region 23 of the inter-element isolation region 14 is connected to the ground for a high frequency signal.

Figure 3A:
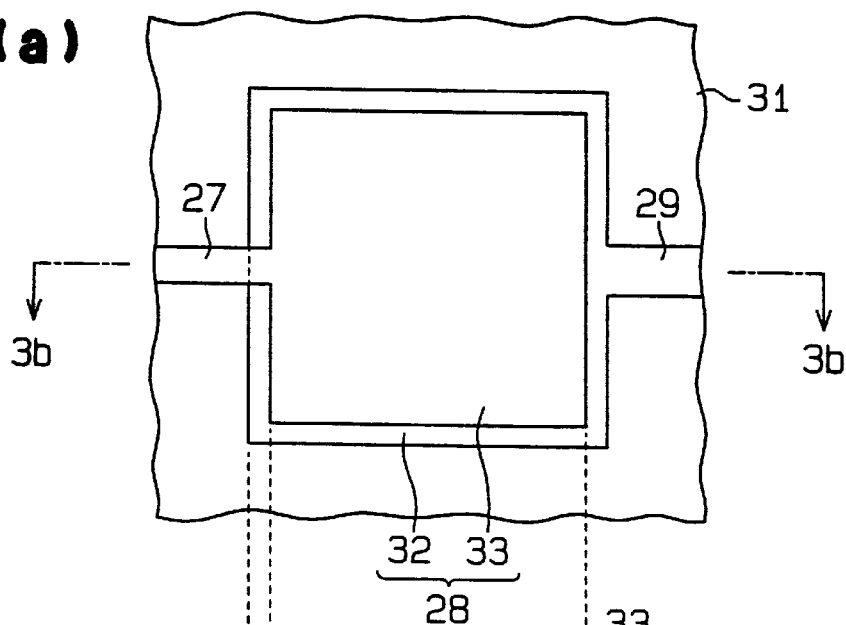
FIG. 3(a) is a plan view of a capacitor as a semiconductor element in FIG. 1.
Figure 3B:
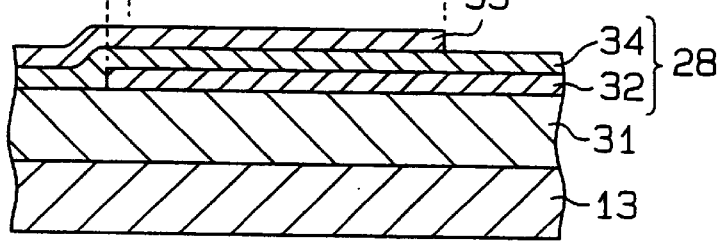
FIG. 3(b) is a cross-sectional view taken along line 3b—3b of FIG. 3(a)

The capacitor 28 is formed on top of the semiconductor region 24. Specifically, referring to FIG. 3(b), an insulating film 31 having a predetermined thickness is formed on the n-type epitaxial layer 13, and the capacitor 28 is disposed on top thereof. The capacitor 28 comprises a first electrode 32 and a second electrode 33, and an insulating film 34 interposed therebetween. The insulating film 34 is preferably formed by an oxide film or nitride film. As shown in FIG. 3(a), the first and second electrodes 32, 33 are substantially in the form of squares, but the configuration of the first and second electrodes 32, 33 may be modified suitably. The first electrode 32 is connected to the electrode layer 26 (FIG. 1) via the wiring 27 and the second electrode 33 is connected to one of the external terminals 17 (FIG. 1) via the wiring 29.

The capacitor 28 has a capacitance which depends on the areas of the first and second electrodes 32, 33, the spacing between the electrodes 32, 33 (or the thickness of the insulating film 34) and the dielectric constant of the insulating film 34. By suitably changing the material of the insulating film 34, the thickness of the insulating film 34 and the areas of both electrodes 32, 33, the capacitance of the capacitor 28 can be changed as desired.

Figure 4:
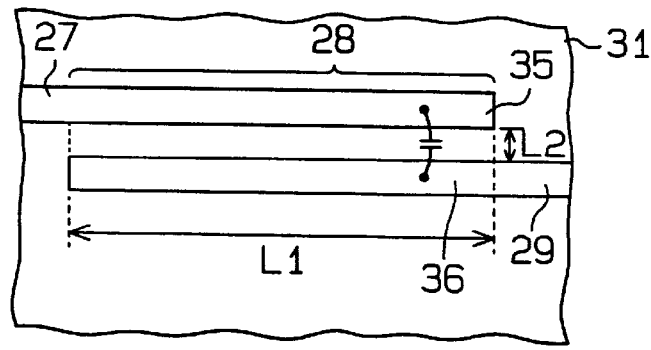
FIG. 4 is a schematic plan view of another capacitor of the semiconductor device of FIG. 1.

The capacitor 28 may be modified in the manner illustrated in FIG. 4. Specifically, the capacitor 28 comprises a first wiring 35 and a second wiring 36 disposed on the insulating film 31 to extend horizontally and substantially parallel to each other. The first wiring 35 is connected via the wiring 27 to the electrode layer 26 shown in FIG. 1 and the second wiring 36 is connected via the wiring 29 to one of the external terminals 17 shown in FIG. 1. In this instance, the capacitor 28 has a capacitance which depends on the oppositely disposed lengths L1 of the first and second wirings 35, 36 and a spacing L2 therebetween. By suitably changing the lengths L1 of the first and second wirings 35, 36 and the spacing L2 therebetween, the capacitance of the capacitor 28 can be changed as desired. Instead of being formed on the semiconductor region 24, the capacitor 28 may be connected to the semiconductor device 11 as an external, discrete component.

Referring back to FIG. 2, the substrate portion 12 is shown as being directly connected to the ground. The ground connection stabilizes the potentials of the substrate portion 12 and the island region 15 disposed on top thereof in the d. c. sense. The substrate portion 12 is also connected to the ground via the parasitic capacitor 25 and the capacitor 28. This ground connection provides a ground connection for the semiconductor region 23. In this manner, the potential of the isolation region 14 is stabilized in a high frequency region, improving the inter-element isolation capability for the island region 15. As a consequence, high frequency interference between the circuits 16 on the respective island regions 15 is reduced.

Figure 5:
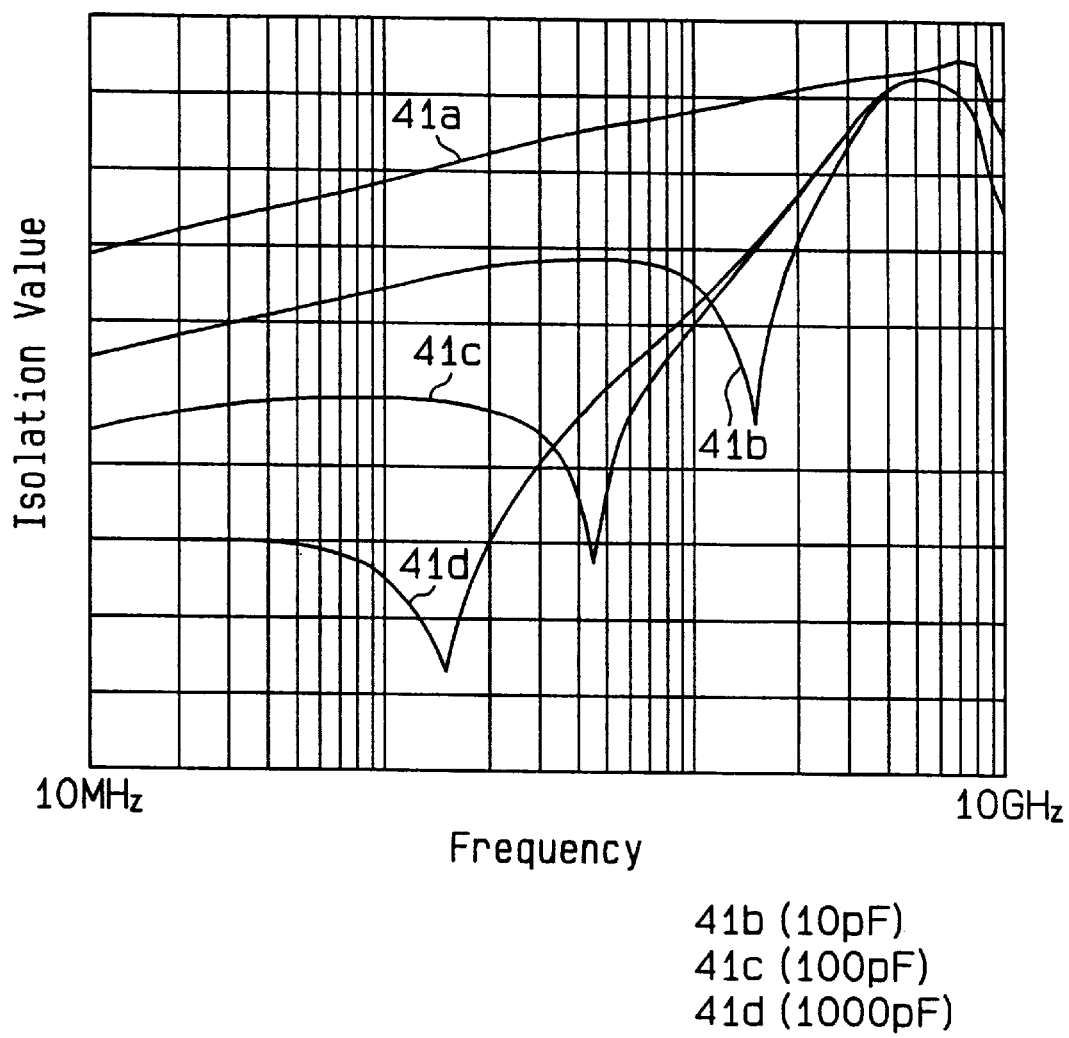
FIG. 5 is a graph of the characteristic curves plotting the isolation value against the frequency.

FIG. 5 graphically shows characteristic curves plotting the isolation value of the semiconductor device 11 against frequency. It is to be understood that the lower the isolation value, the better the isolation response. A curve 41a shows a characteristic curve of a conventional semiconductor device or a semiconductor device having a substrate portion which is not connected to the ground via a parasitic capacitor and a separate capacitor. Curves 41b–41d show characteristic curves of the semiconductor device 11 according to the present embodiment as a function of the capacitance of the parasitic capacitor 25 as a parameter.

It will be apparent that the greater the capacitance of the capacitor 28 (see the curve 41d corresponding to 1000 pF), the better the isolation response achieved for the semiconductor device 11. A frequency band in which an excellent isolation response is exhibited is determined by the capacitances of the parasitic capacitor 25 and the capacitor 28, and reactances presented by the wirings 27, 29 the bonding wire 18 and wiring material inclusive of lead frame (not shown) which are present between the electrode layer 26 and the ground. The influences of such reactances will be evident by reference to characteristic curves shown in FIG. 6.

Figure 6:
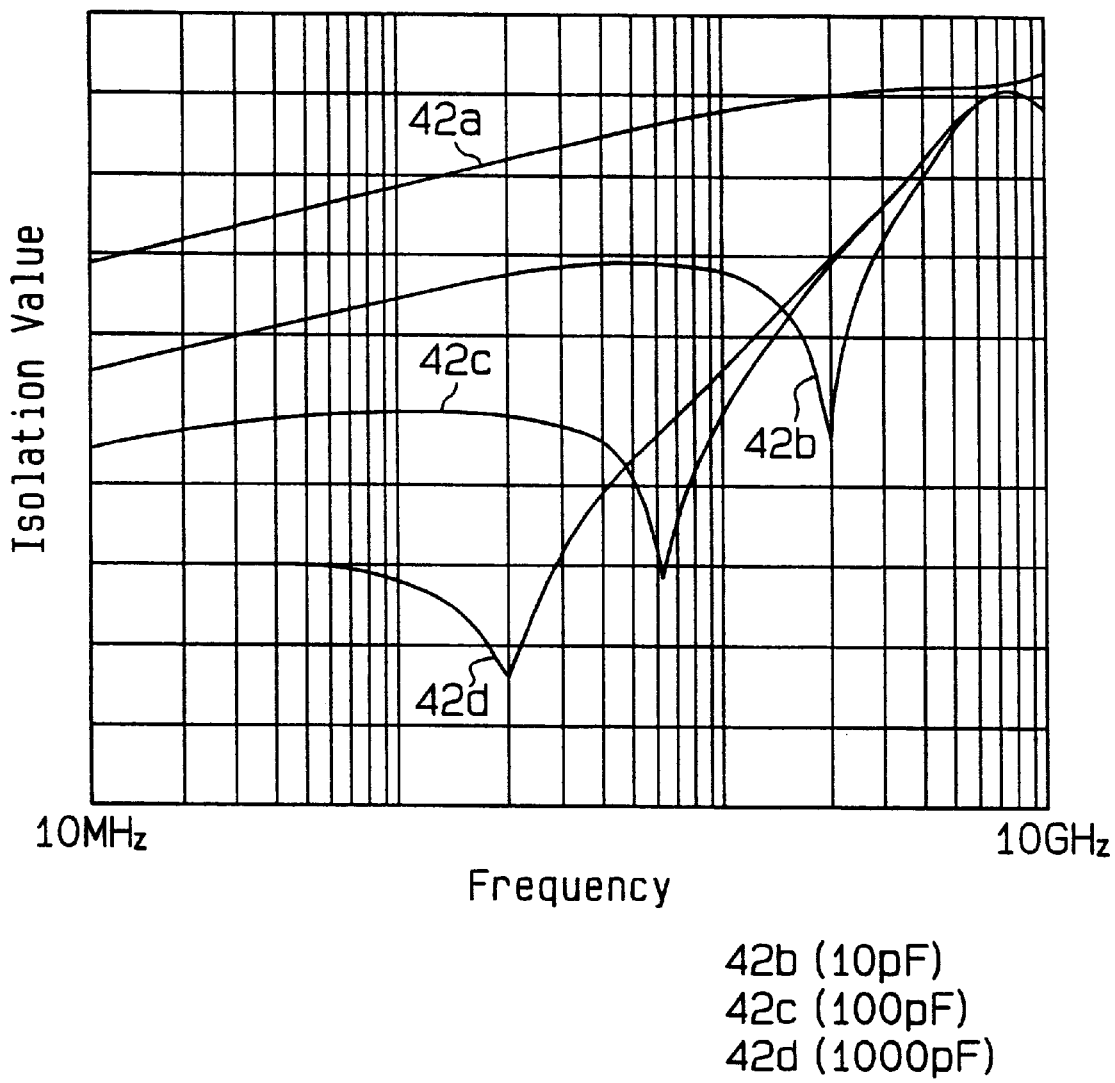
FIG. 6 is a graph of another example of characteristic curves plotting the isolation value against the frequency.

FIG. 6 graphically shows characteristic curves obtained when the reactances of the semiconductor device of FIG. 5 is reduced to one-half by changing the number of element wires in the bonding wire 18. The capacitances for the curves 42a–42d in FIG. 6 correspond to the capacitances for the curves 41a–41d shown in FIG. 5. It may be seen from FIG. 6 that a frequency band in which an excellent isolation response is exhibited for the curve 42d is shifted to a higher frequency band as compared with the curve 41d shown in FIG. 5. The frequency band in which an excellent isolation response is exhibited can be chosen as desired by suitably changing the capacitances of the parasitic capacitor 25 and the capacitor 28 and reactances associated with wiring materials. In this manner, the circuits 16 on the semiconductor device 11 are allowed to operate in a stable manner in a frequency band in which a signal leakage across the island regions 15 is reduced and which is determined in accordance with the capacitances of the parasitic capacitor 25 and the capacitor 28.

Second Embodiment

Figure 7:
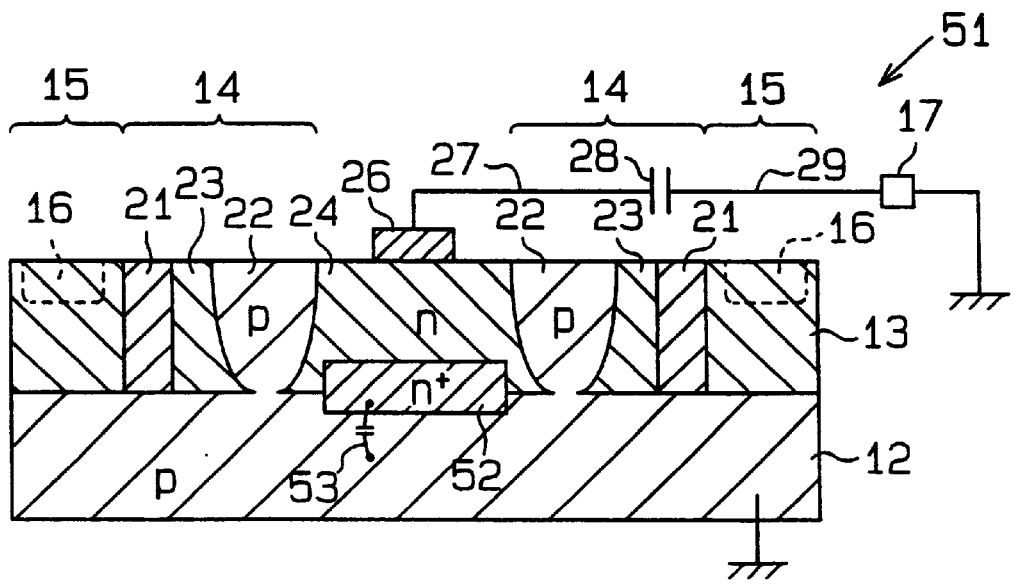
FIG. 7 is a cross-sectional view of a semiconductor device according to a second embodiment of the present invention.

Referring to FIG. 7, a semiconductor device 51 according to a second embodiment of the present invention will now be described. As shown in FIG. 7, the semiconductor device 51 differs from the semiconductor device 11 of the first embodiment in that an n$^+$type embedded layer 52 is provided between the substrate portion 12 and the n-type epitaxial layer 13. Specifically, the embedded layer 52 is formed between the substrate portion 12 and the semiconductor region 24, and has an impurity concentration which is higher than the impurity concentration of the n-type epitaxial layer 13 which defines the semiconductor regions 23, 24. Accordingly, the semiconductor device 51 has a parasitic capacitor 53 of a greater capacitance than the parasitic capacitor 25 of the semiconductor device 11 of the first embodiment. The capacitance of the parasitic capacitor 53 is determined by the impurity concentrations in the embedded layer 52 and the substrate portion 12 and an area of a junction between the embedded layer 52 and the substrate portion 12.

The substrate portion 12 and the semiconductor region 24 are connected to the ground via the parasitic capacitor 53 and the capacitor 28, which improves the isolation of high frequency signals and reduces high frequency interference between the circuits 16. In particular, the presence of the n$^+$type embedded layer 52 increases the capacitance of the parasitic capacitor 53, thus extending a frequency band in which excellent isolation response is exhibited.

The impurity concentration in the embedded layer 52 is chosen as desired in the manufacturing process. Accordingly, the parasitic capacitor 53 having a capacitance which is preferred for operation in the high frequency region can be easily formed.

Figure 8:
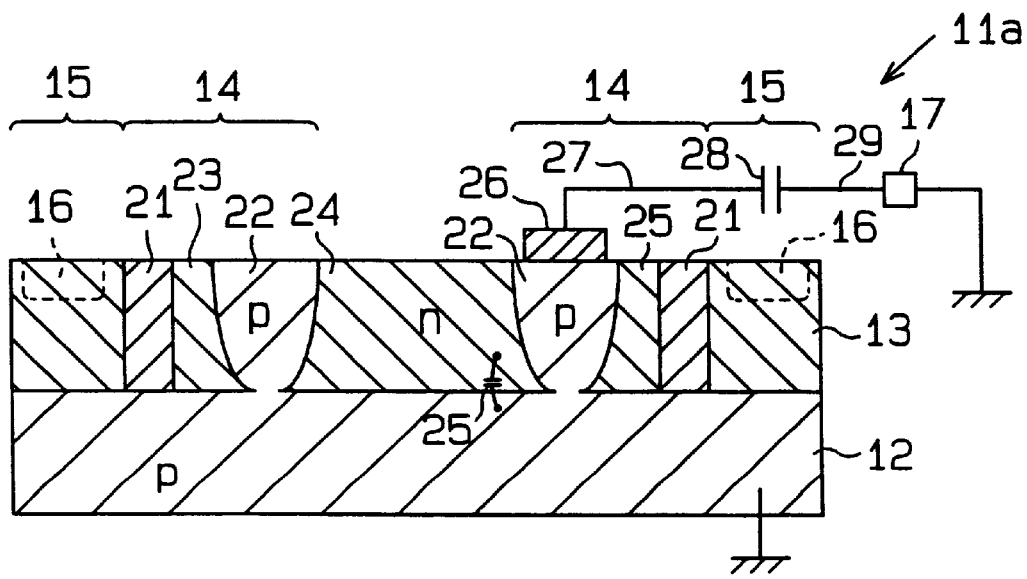
FIG. 8 is a cross-sectional view of a first semiconductor device having a modified ground connection location.
Figure 9:
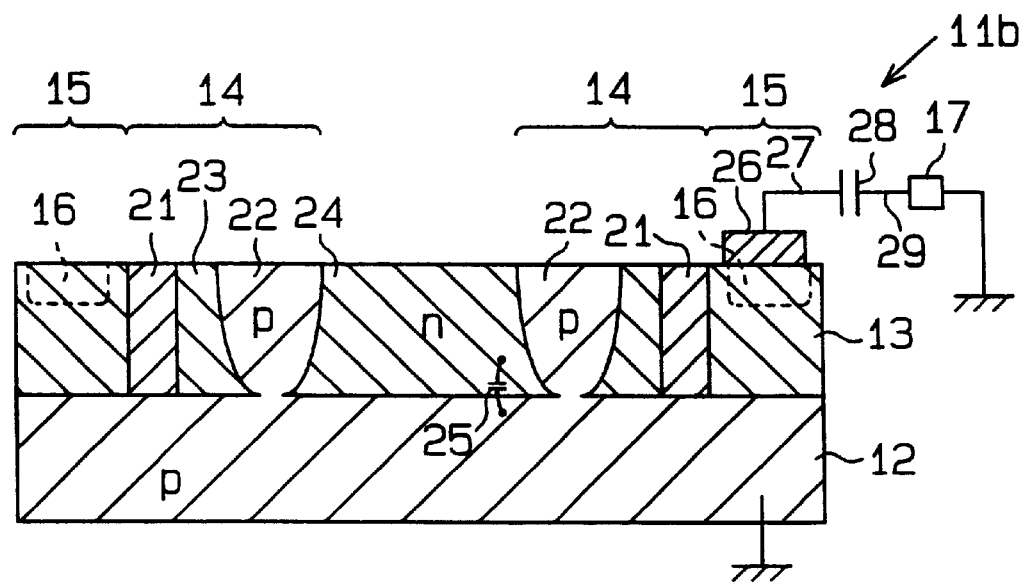
FIG. 9 is a cross-sectional view of a second semiconductor device having a modified ground connection location.

It should be apparent to those skilled in the art that the present invention may be embodied in many other specific forms without departing from the spirit or scope of the invention. Particularly, it should be understood that the invention may be embodied in the following forms:

In the described embodiments, the ground connection location may be modified. Specifically, as shown in FIG. 8, an electrode layer 26 may be disposed on top of the second isolation area 22 in the isolation region 14 to allow the substrate portion 12 to be connected to the ground via the capacitor 28. Alternatively, the electrode layer 26 may be disposed on at least one of the island regions 15 to allow the epitaxial layer 13 to be connected to the ground via the capacitor 28, as shown in FIG. 9.

Figure 10:
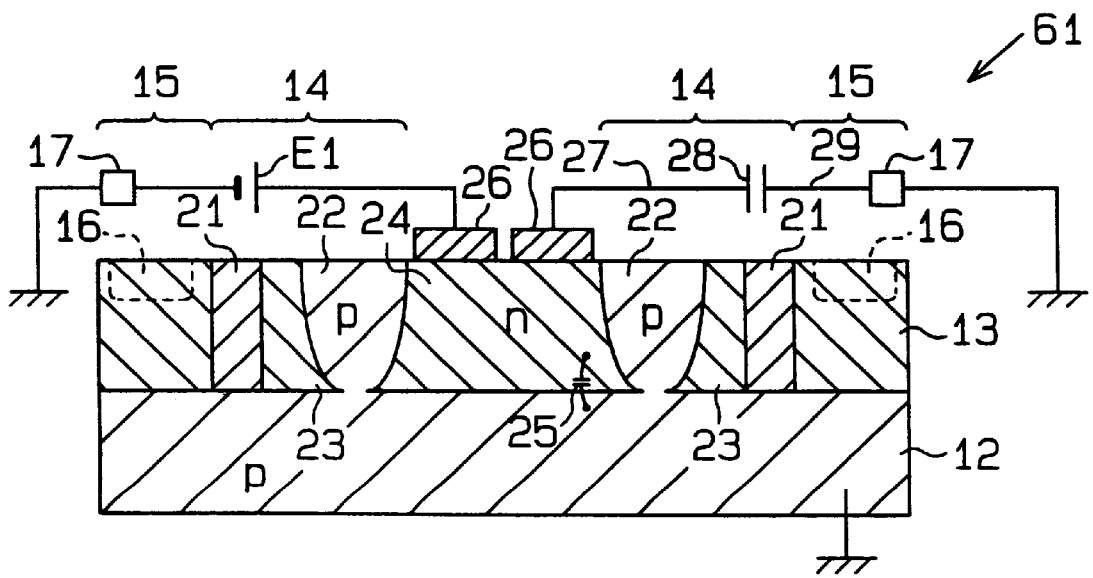
FIG. 10 is a cross-sectional view of a semiconductor device with a bias voltage is applied thereto.

As shown in FIG. 10, a semiconductor device 61 may include a d. c. source El for applying a predetermined bias voltage to the semiconductor region 24. The parasitic capacitor 25 then has a capacitance that is changed in accordance with the bias voltage. By suitably choosing a bias voltage from the d. c. source El, the parasitic capacitor 25 operates as a variable capacitance element. The capacitance can be changed as desired. In this manner, the capacitance of the parasitic capacitor 25 or a bias voltage from the d. c. source El may be chosen in accordance with a desired frequency band.

Figure 11:
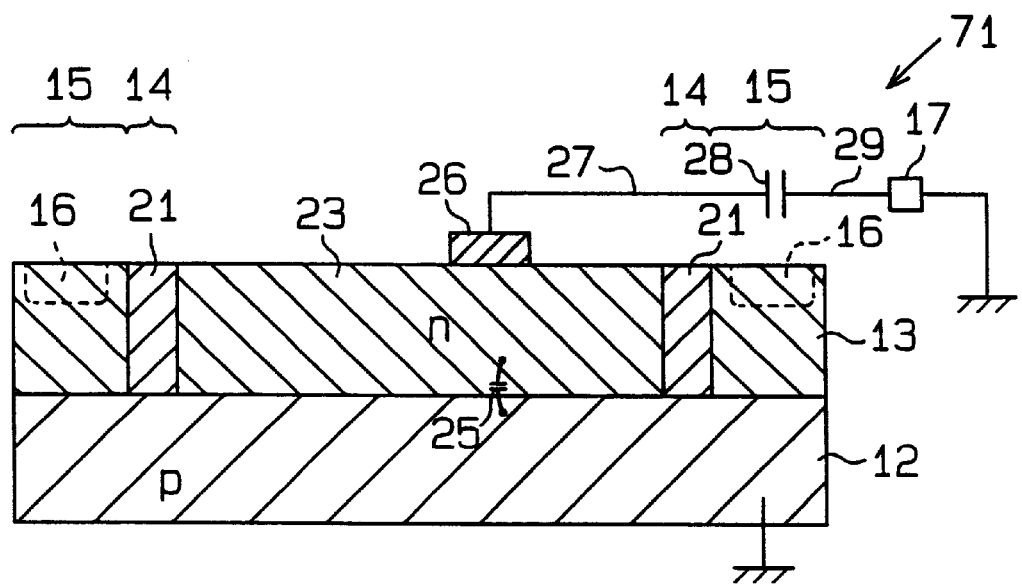
FIG. 11 is a cross-sectional view of a semiconductor device in which the second isolation area is omitted.

In the described embodiments, either one of the first and second isolation areas 21, 22 may be omitted. FIG. 11 shows a semiconductor device 71 in which the second isolation area 22.

Figure 12:
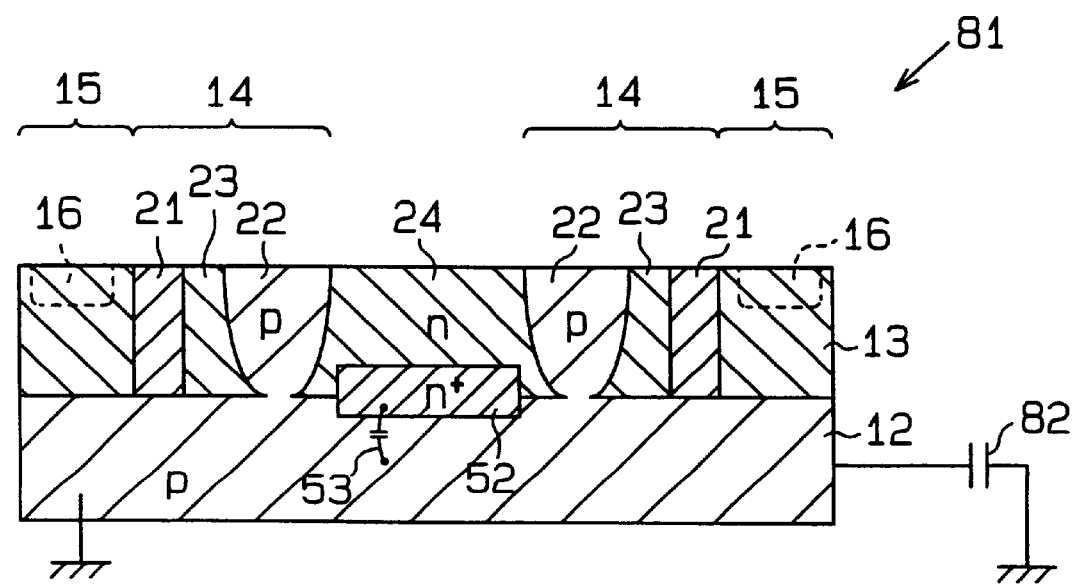
FIG. 12 is a cross-sectional view of a semiconductor device having a modified ground connection location.

In the described embodiments, a ground connection is made to the front surface of the semiconductor regions 23, 24 or at least one of the island regions 15, but the ground 10 connection may be made to the rear surface or a lateral surface of the substrate portion 12. FIG. 12 shows an example of a ground connection made to the lateral surface of the substrate portion 12 via a capacitor 82. For instance, the semiconductor region 24 is connected to the ground via a parasitic capacitor 53 or a combination of a parasitic capacitor 53 and a capacitor 82. For instance, the capacitor 82 may be an external discrete component.

In the described embodiments, the number of island regions 15 may be changed as desired. In such instance, at least one of a plurality of island regions 15 is connected to the ground via the capacitor 28 as shown in FIG. 9.

In the described embodiments, rather than choosing 0 volt as a ground potential, any desired positive or negative potential may be chosen as the ground potential. In such instance, the capacitor 28 is connected to a supply line which feeds the positive or negative potential.

Figure 13:
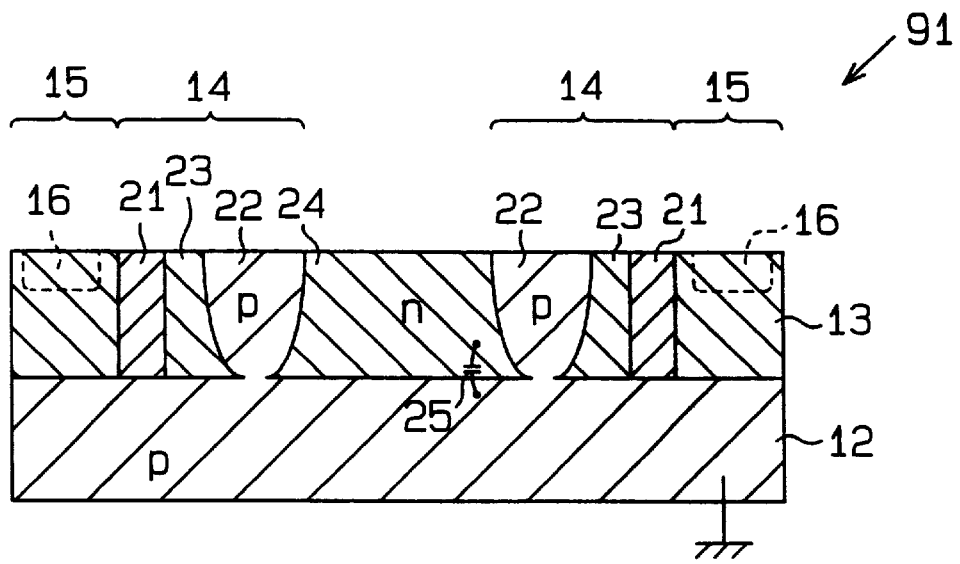
FIG. 13 is a cross-sectional view of a semiconductor device having a modified ground connection.
Figure 14:
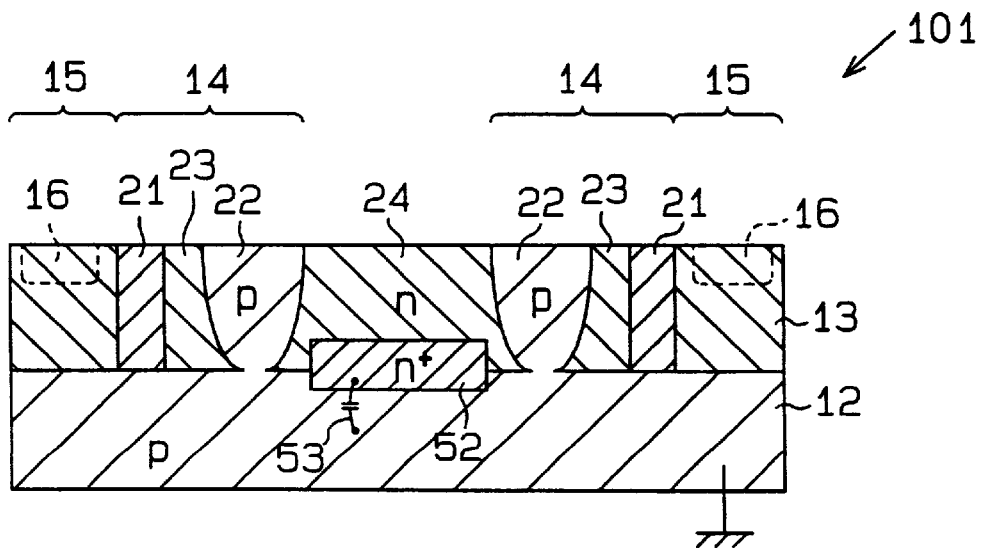
FIG. 14 is a cross-sectional view of a semiconductor device having a modified ground connection.

In the described embodiments, the capacitor 28 may be omitted, as illustrated in FIGS. 13 and 14. In a semiconductor device 91 shown in FIG. 13, the semiconductor region 24 is connected to the ground via a parasitic capacitor 25. In a semiconductor device 101 shown in FIG. 14, the semiconductor region 23 and an n$^+$type embedded layer 52 are connected to the ground via the parasitic capacitor 53. Again, the isolation response between the individual circuits 16 is improved.

Therefore, the present examples and embodiments are to be considered as illustrative and not restrictive and the invention is not to be limited to the details given herein, but may be modified within the scope and equivalence of the appended claims.

What is claimed is:

1. A semiconductor device comprising:
   a substrate portion of a predetermined conductivity type connected to a ground;
   a semiconductor layer disposed on the substrate portion, the semiconductor layer including a plurality of island regions and a corresponding plurality of isolation regions that surround the respective island regions for electrically separating island regions from each other, wherein each of the island regions includes a circuit capable of providing a predetermined function; and
   a first capacitor having a first terminal connected to either the substrate portion or the semiconductor layer and a second terminal connected to the ground.

2. The semiconductor device according to claim 1, wherein each of the isolation regions includes a conductive region having a conductivity type opposite to the conductivity type of the substrate portion, such that a parasitic capacitor is formed between the substrate portion and the conductive region.

3. The semiconductor device according to claim 2, wherein the isolation region includes an insulating region that surrounds each of the island regions.

4. The semiconductor device according to claim 3, wherein the insulating region comprises a dielectric.

5. The semiconductor device according to claim 4, wherein the island regions have a conductivity type opposite to the substrate portion conductivity type, wherein the isolation region includes a semiconductor isolation region having a conductivity type of opposite to the island region and surrounding the insulating region.

6. The semiconductor device according to claim 5, wherein the first terminal of the first capacitor is connected to the semiconductor isolation region.

7. The semiconductor device according to claim 5, wherein the first terminal of the first capacitor is connected to the island region.

8. The semiconductor device according to claim 2, further comprising a source for applying a voltage to the conductive region.

9. The semiconductor device according to claim 8, wherein the source includes a positive terminal connected to the semiconductor layer and a negative terminal connected to the ground.

10. The semiconductor device according to claim 2, wherein the first terminal of the first capacitor is connected to the conductive region.

11. The semiconductor device according to claim 2, wherein the parasitic capacitor has a capacitance that is determined in accordance with an area of a junction between the substrate portion and the semiconductor layer.

12. The semiconductor device according to claim 2, further comprising a wiring connected to the first capacitor, wherein at least one of the circuits of one of the island regions operates within a predetermined frequency band that depends on the capacitance of the parasitic capacitor and the reactance of the wiring.

13. The semiconductor device according to claim 12, wherein the wiring has a sufficient number of element wires to reduce a reactance thereof.

14. The semiconductor device according to claim 2, further comprising an embedded layer of a higher concentration of impurities than the conductive region and disposed between the substrate portion and said conductive region, the parasitic capacitor being defined between the substrate portion and the embedded layer and having a capacitance that depends on the impurity concentration of the embedded layer.

15. The semiconductor device according to claim 14, wherein the first terminal of the first capacitor is connected to the conductive region.

16. The semiconductor device according to claim 14, wherein the first terminal of the first capacitor is connected to the substrate portion.

17. The semiconductor device according to claim 1, wherein the first capacitor is formed on the semiconductor layer.

18. The semiconductor device according to claim 17, wherein the first capacitor includes a first electrode and a second electrode disposed opposite to each other and an insulating film disposed between the first and second electrodes.

19. The semiconductor device according to claim 18, wherein the first capacitor includes a first wiring disposed on the semiconductor layer, and a second wiring substantially parallel to and spaced from the first wiring by a predetermined distance, the first capacitor having a capacitance formed as a parasitic capacitance between the first and second wirings.

20. The semiconductor device according to claim 1, wherein the parasitic capacitor has a capacitance that prevents an influence of a signal leakage between the island regions.

21. A semiconductor device comprising:
    a substrate portion of a predetermined conductivity type connected to a ground; and
    a semiconductor layer disposed on the substrate portion and including a plurality of island regions and an isolation region for electrically separating the adjacent island regions from each other, wherein each of the island regions contains a circuit capable of providing a predetermined function, and the isolation region includes a conductive region having a conductivity type opposite to the substrate portion conductivity type, wherein a parasitic capacitor is formed between the substrate portion and the conductive region.

22. A semiconductor device comprising:
    a substrate portion of a predetermined conductivity type connected to a ground;
    a semiconductor layer disposed on the substrate portion and including a plurality of island regions and an isolation region for electrically separating adjacent island regions from each other, wherein each of the island regions contains a circuit capable of providing a predetermined function, and the isolation region includes a conductive region having a conductivity type opposite to the substrate portion conductivity type; and
    an embedded layer of a higher concentration of impurities than the conductive region and disposed between the substrate portion and the conductive region, a parasitic capacitor being formed between the substrate portion and the embedded layer and having a capacitance that depends on the impurity concentration of the embedded layer.

* * * * *